United States Patent [19]

Hartman et al.

[11] 4,232,328

[45] Nov. 4, 1980

[54] DIELECTRICALLY-ISOLATED INTEGRATED CIRCUIT COMPLEMENTARY TRANSISTORS FOR HIGH VOLTAGE USE

[75] Inventors: Adrian R. Hartman, New Providence; Terence J. Riley, Warren; Peter W. Shackle, Bridgewater, all of N.J.

[73] Assignee: Bell Telephone Laboratories, Incorporated, Murray Hill, N.J.

[21] Appl. No.: 971,632

[22] Filed: Dec. 20, 1978

[51] Int. Cl.³ .............................................. H01L 27/04
[52] U.S. Cl. .................................... 357/49; 357/13; 357/44; 357/58; 357/89
[58] Field of Search .................. 357/49, 58, 44, 13, 357/89, 90, 34

[56] References Cited

U.S. PATENT DOCUMENTS

| | | | |
|---|---|---|---|
| 2,767,358 | 10/1956 | Early | 357/34 |
| 3,412,295 | 11/1968 | Grebene | 357/49 |
| 3,628,064 | 12/1971 | Camenzind et al. | 357/49 |
| 3,850,707 | 11/1974 | Bestland | 357/49 |
| 3,865,649 | 2/1975 | Beasom | 357/49 |
| 3,895,392 | 7/1975 | Polata et al. | 357/49 |
| 3,944,447 | 3/1976 | Magdo et al. | 357/49 |
| 3,990,102 | 11/1976 | Okuhara et al. | 357/49 |
| 4,086,610 | 4/1978 | Clark | 357/34 |
| 4,146,905 | 3/1979 | Appels et al. | 357/49 |

OTHER PUBLICATIONS

Chang et al., IBM Technical Disclosure Bulletin, vol. 11, No.12, May 1969, pp. 1653-1654.

Primary Examiner—William D. Larkins
Attorney, Agent, or Firm—H. W. Lockhart

[57] ABSTRACT

Integrated circuit complementary transistors for high voltage switching applications are fabricated in separate dielectrically-isolated pockets (12), (14) of high resistivity silicon, supported in a conductive medium (11) such as polycrystalline silicon, using surface adjacent conductivity type zones constituting emitter (19), (23), base (16), (20) and collector zones (17), (21). In one embodiment using high resistivity (75–300 ohm cm) silicon, referred to as $\pi$ material, for the material of the pocket, one transistor is a PN$\pi$P device, and the other is an NP$\pi$N. In the PN$\pi$P the reverse-biased base-collector pn junction is the interface between the N base zone (16) and the $\pi$ portion (12) of the collector zone. In the NP$\pi$N transistor the base-collector junction is the interface between the lightly doped $\pi$ extension (14) of the base zone (20) and the N collector zone (21). A connection (32) is provided to the conductive substrate to enable application of a suitable potential thereto.

6 Claims, 4 Drawing Figures

DIELECTRICALLY-ISOLATED INTEGRATED CIRCUIT COMPLEMENTARY TRANSISTORS FOR HIGH VOLTAGE USE

CROSS-REFERENCE TO RELATED APPLICATION

Cross Reference is made to related application Ser. No. 972,023 of A. R. Hartman-T. J. Riley-P. W. Shackle Case 9-7-7, Control Circuitry for Gated Diode Switches, filed concurrently herewith.

BACKGROUND OF THE INVENTION

This invention relates to semiconductor integrated circuits of the type in which the electrical isolation between circuit elements comprises solid dielectric material. More particularly, it relates to complementary transistors fabricated in dielectically isolated integrated circuits for high voltage, low current use.

The control of signals in circuits in which voltage differences may reach or exceed 500 volts requires semiconductor integrated circuits with a high degree of electrical isolation. One integrated circuit structure of this type comprises an array of pockets of single crystal silicon semiconductor material supported within a conductive medium and isolated therefrom by a film of dielectric material such as silicon dioxide surrounding the sides and bottom of each pocket. The surfaces of the pockets are coplanar thus enabling making a conductive pattern interconnecting elements in the various pockets. One way of making such a structure is by forming, in one major surface of a semiconductor body, a network of grooves conforming to the desired isolation pattern between semiconductor elements of the prospective integrated circuit. In one embodiment this network is produced by anisotropic etching using etch resistant masks. A dielectric layer, such as silicon dioxide, then is deposited on the grooved surface to provide a thin but complete layer thereon. A backing layer is applied to the surface of the dielectric layer for support and its surface is made flat and parallel to the opposite major surface. Polycrystalline silicon is one preferred material for this use because it has thermal expansion properties similar to monocrystalline silicon and can be rendered conductive. The semiconductor body then is reversed and semiconductor material is removed from the opposite major surface to a depth sufficient to reach the bottom of the grooves, thereby producing an array of isolated semiconductor pockets, having a common planar surface suitable for conductive patterns interconnecting elements formed in the isolated pockets.

However, making useful complementary transistors for high voltage use in dielectrically-isolated integrated form as described above is a problem. In U.S. Pat. No. 3,895,392 there is disclosed a dielectrically-isolated semiconductor integrated circuit having complementary transistors is separate isolated pockets. However, in the high voltage switching circuits such as are disclosed in the concurrently filed application of applicants referred to hereinabove, the arrangement disclosed by U.S. Pat. No. 3,895,392 is unsuitable. In particular, the semiconductor material of the isolated pockets must be of high resistivity in order to sustain the voltage breakdown levels for the devices of interest. More particularly, the pockets all are of the same semiconductor material, in this case the original single crystal. Thus, all of the semiconductor pockets are of the same conductivity type and impurity distribution. The provision of differing conductivity type material in separate pockets presently requires complex and costly fabrication steps.

Moreover, because of the need to sustain high breakdown voltages, it is desirable to avoid the inclusion in dielectrically isolated transistors of this type of buried zones of high conductivity material within the pockets which might, in specific situations, enhance transistor performance.

Thus an object of the invention is dielectrically isolated complementary transistors having good high voltage characteristics in which the emitter, base and collector zones are all adjacent the major surface.

SUMMARY OF THE INVENTION

In accordance with this invention, an embodiment comprises a composite semiconductor device for an integrated circuit having a plurality of pockets of semiconductive material dielectrically isolated from each other by a layer of insulating material underlying the bottom and sides of the pocket, with all the pockets having a surface in a common plane and being supported in a layer of semiconductive material. Each of the pockets comprises a layer of monocrystalline semiconductive material of a first conductivity type and of relatively high resistivity and substantially uniform impurity distribution. One of the pockets contains a PNP transistor and another pocket an NPN transistor and both transistors consist only of surface adjacent conductivity type zones constituting the emitter, base and collector zones.

One of the transistors comprises a base having two zones of conductivity in which the lightly doped material of the pocket is an extension of the higher conductivity portion and the base-collector junction is at the boundary of the high conductivity collector zone. The other transistor comprises two conductivity zones forming the collector with the base-collector junction at the boundary of the high conductivity base zone.

Both transistors intrinsically are lateral transistors susceptible of both lateral and vertical current flow in proportions subject to variation depending on the operating conditions imposed. Significant to the performance of both transistors is the existence of a potential in the supporting layer of semiconductor material which underlies the pockets. The effect of this potential is to induce a charge of greater or lesser degree in the insulating layer underlying the pocket, which attracts or repels the injected minority carriers depending upon polarity. A high substrate potential of either polarity will enhance the gain compression of one transistor of the pair, while that of the other will be correspondingly reduced. However the latter transistor is an effective switching element and particularly is suitable for use in the circuit configuration disclosed in the concurrently filed application referred to hereinabove.

BRIEF DESCRIPTION OF THE DRAWING

The invention and its other objects and features will be more clearly understood from the following detailed description taken in conjunction with the drawing in which.

DETAILED DESCRIPTION

Figure 1:
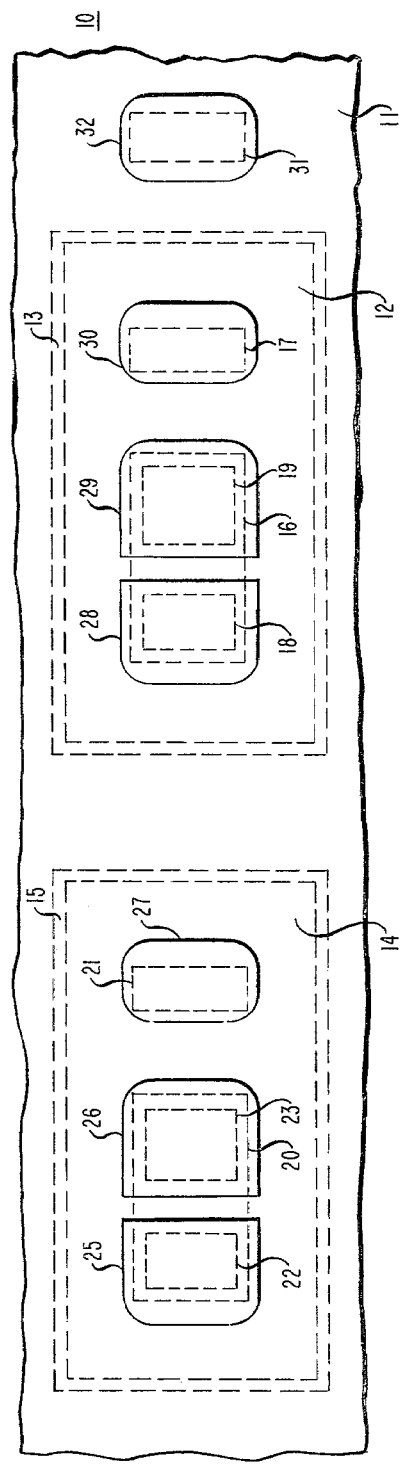
FIG. 1 is a plan view of a portion of a semiconductor integrated circuit chip including two dielectrically-isolated pockets containing complementary transistors in accordance with this invention.
Figure 2:
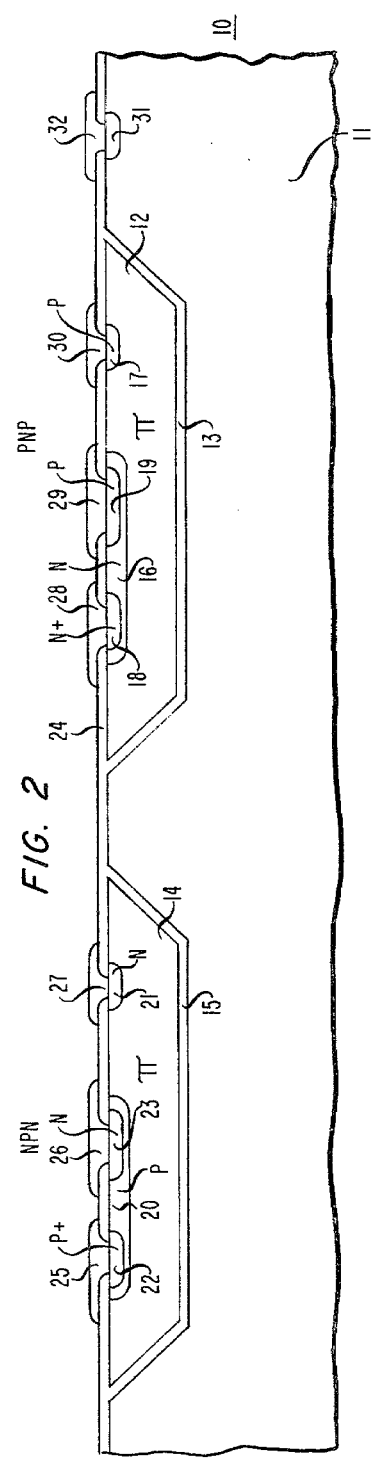
FIG. 2 is a section view taken through the chip portion of FIG. 1.

FIGS. 1 and 2 show in plan and section respectively, a portion 10 of a semiconductor integrated circuit including dielectrically isolated pockets 12 and 14. Where possible, the same reference numerals are used in FIGS. 1 and 2 to denote the same features. As is apparent to those skilled in the art, the drawing is not to scale and particularly is distorted by enlargement of the vertical with respect to horizontal dimensions. In a specific embodiment the pockets 12 and 14 are of high resistivity single crystal silicon in the range of from about 75 to 300 ohm cm. This material is of weak P-type conductivity denoted by the symbol $\pi$. Pockets 12 and 14 are supported in a matrix or backing 11 of polycrystalline silicon and isolated electrically by layers 13 and 15 respectively, of silicon dioxide.

The resistivity range of from about 75 to about 300 ohm cm is primarily useful for devices designed for breakdown voltages of about 500 volts. In devices designed for other voltages, high resistivity, P-type material may range from not less than 10 ohm cm to the maximum value available, presently 10,000 ohm cm.

One method for producing this dielectrically isolated structure comprises starting with a wafer of single crystal silicon of high resistivity material as stated above which will constitute the pockets 12 and 14. In a specific embodiment this starting material has a uniform impurity distribution of about $5 \times 10^{13}$ atoms per cc corresponding to a nominal resistivity of 200 ohms cm. The wafer is masked on one surface to define the areas which ultimately constitute the bottom surfaces of the isolated pockets 12 and 14. The masked surface then is subjected to an anisotropic etchant which produces mesas surrounded by the V-shaped trenches. This anisotropic process may be carried out using crystalline material having surfaces in the (100) plane and using hydroxide solutions as etchants. The V-shaped grooves are produced by the difference in the rate of attack on the (100) and the (111) crystallographic planes. The trench walls are disposed at an angle of about 57.5 degrees to the plane of the surface. Such processes are well known and are disclosed, for example, in U.S. Pat. No. 3,765,969 to R. C. Kragness and H. A. Waggener.

After the trenches have been formed, a film of silicon dioxide is formed on the etched surface of the wafer now constituted by a series of mesas defined by the network of the trenches. This oxide layer has a thickness of from about 1.5 to about 5 microns and in a specific embodiment is about 3.5 microns. In the next step polycrystalline silicon is vapor deposited over the oxide coated surface to fill the trenches and to provide a suitable support matrix 11. In a specific embodiment, the polycrystalline layer 11 is of N-type conductivity having a resistivity of the order of 100 ohm cm. Finally, after making the polycrystalline surface flat and parallel to the single crystal surface, single crystal material is removed from the opposite face of the wafer either chemically or mechanically, or a combination of both, to a depth sufficient to reach beyond the bottom or apex of the trenches. The structure thus produced is that generally as shown in FIG. 2 before the fabrication of the transistors in the isolated pockets by the introduction of the various conductivity type zones.

In the pocket 12 shown on the right in FIGS. 1 and 2, and with reference particularly to FIG. 2, there is formed a PNP transistor comprising an N-type base zone 16 within the $\pi$ zone 12 which constitutes one portion of the collector. Zone 19 constitutes a P-type emitter within the base zone 16 and N+type zone 18 is a high conductivity zone for making contact to the base zone 16. Similarly, high conductivity P-type zone 17 constitutes the high conductivity portion of the collector. Metallic contacts 28, 29, and 30 constitute the base, emitter and collector electrodes, respectively of the PNP transistor.

Similarly, in the NPN transistor in the pocket 14 on the left, zone 20 is the P-type base having high conductivity contact zone 22. Zones 23 and 21 are N type emitter and collector zones, respectively. In this transistor the $\pi$ zone of the pocket 14 constitutes a lightly doped extension of the base. Metallic contacts 25, 26, and 27 are electrodes for the base, emitter and collector, respectively.

Referring to the PNP transistor on the right in the plan view of FIG. 1, dotted outline 16 indicates the extent of the base zone, dotted outline 19 that of the emitter zone, and outline 17 the low resistance collector zone. Dotted outline 18 outlines the low resistance contact zone to the base zone 16. The base, emitter and collector electrodes are defined by the solid outlines 28, 29 and 30, respectively.

Similarly, in the NPN transistor on the left outline 20 is the base zone, outline 23 the emitter zone and outline 21 the collector zone. Outline 22 indicates the P+ base contact zone and solid lines 25, 26, and 27 respectively the base, emitter and collector electrodes.

Low resistance contact to the polycrystalline layer 11 is provided by the high conductivity N zone 31 to which there is applied the metallic electrode 32.

Other significant details of this specific embodiment relate to the topographical arrangement of the surface-adjacent conductivity type zones within each isolated semiconductor pocket. The lateral spacing between the boundary of a pocket and the edge of any diffused zone within the pocket is at least about 45 microns. The metal electrodes overlie the oxide surrounding the several conductivity type zones which they contact and extend beyond the overlaid PN junction a distance of about 20 microns, thereby providing a "fieldplate" effect which increases the breakdown voltage of the junction. The separation between the facing boundary portions of the emitter and base zones is at least 10 microns and between emitter and collector electrodes about 40 microns. The upper surface of the device is covered by a passivating film typically of from 2 to 6 microns thickness of silicon dioxide. This film inhibits induced voltage breakdown in the underlying silicon which might be caused by overlying interconnections. In a specific embodiment, the pockets 12 and 14 have a thickness in the range of from about 30 to about 50 microns. However, the depth of the pockets may be less or greater than these values from a minimum of 10 ohm cm to a maximum which is not undesirable economically.

In a specific method of making these devices the P-type base zone 20 of the NPN transistor is formed first by the ion implantation of boron at a dosage of $1.6 \times 10^{15}$ atoms per cm$^2$ at 30 KEV. The P-type base zone has a depth of from about 2 to 6 microns, adjusted by heat treatment so that the final base width is at least one micron.

The N-type base zone 16 of the PNP transistor is formed, likewise at a depth of from about 2 to 6 microns, by the ion implantation of phosphorus at a dosage of $1 \times 10^{15}$ atoms per cm$^2$ at 30 KEV. The sheet resistance of this N-type base zone is about 30 ohms per square. Next, the P-type zones 17 and 19 of the PNP transistor and the P-type zone 22 of the NPN transistor are formed by a masked predeposit of boron using boron nitride or boron oxide sources. These zones are shallow, typically from about 1 to 4 microns, with a sheet resistivity of about 13 ohms per square. Finally, the N-type emitter and collector zones 23 and 21, respectively, of the NPN transistor, the N-type zone 18 of the PNP transistor and the N-type contact zone 31 to the polycrystalline layer 11 are introduced using a phosphorus oxychloride predeposit and drive-in heat treatment, again to a depth of from about 1 to 4 microns, to provide a sheet resistance of about 4 ohms per square.

Figure 3:
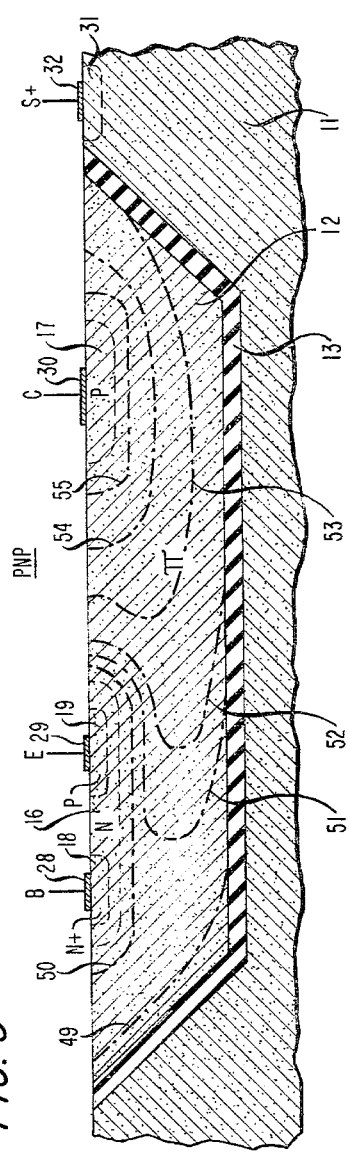
FIGS. 3 and 4 are section views of the complementary transistors separately showing typical lines of equipotential generated in each device during a particular operating condition.
Figure 4:
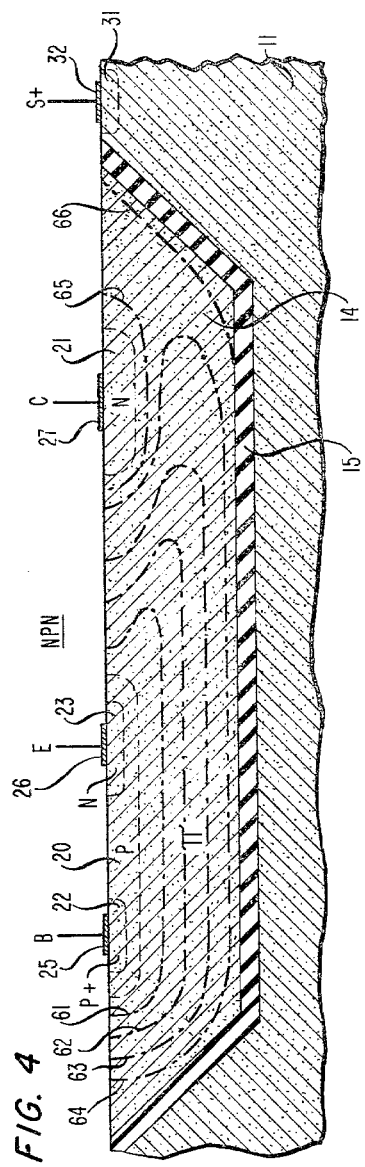

The operation of the complementary pair of transistors will be described in connection with FIGS. 3 and 4 showing the PNP and NPN transistors separately, respectively. Where applicable, reference numerals used in FIGS. 1 and 2 are used for the same elements in FIGS. 3 and 4. The electrode 32 and N-type conductivity zone 31 for making contact to the substrate is shown in both FIGS. 3 and 4 to indicate that in operation the potential applied to the substrate is controlled.

In FIG. 3 the broken lines 49 to 55 and in FIG. 4 broken lines 61 to 66 depict lines of equipotential produced during operation of the two transistors under standard transistor bias conditions and with a relatively high positive bias applied to the substrate. The charge carrier current which is of interest is that which transverses the $\pi$ zone 12 or 14. Charge carrier current tends to follow flow lines which are generally perpendicular to the lines of equipotential. It will be appreciated that the lines of equipotential shown in FIGS. 3 and 4 are representative, in section, of planes or envelopes and that the lines ideally are equi-spaced, although not so shown because of the drawing scale distortion.

In the PNP transistor shown in FIG. 3 charge carriers, in this case holes, injected from the emitter zone 19 into the base zone 16 drift through the lightly doped $\pi$ zone portion of the collector to the higher conductivity portion P zone 17. Current flow under these conditions largely is lateral because the substrate potential induces a positive charge in the substrate 11 which tends to repel the hole carriers. Holes injected so as to transverse perpendicular to the upper boundaries of the "toe" portions of lines 51 and 52 generally are repelled by the induced charge in the substrate so that they drift across the $\pi$ zone 12 and up to P zone 17.

In the NPN transistor of FIG. 4, on the other hand, electrons injected from the emitter zone 23 are attracted by the positive charge in the substrate and a major portion of the carrier current is constituted by a flow downward to the bottom of the pocket and along the oxide layer to near the surface and across to the N-type collector zone 21.

If the substrate potential is changed to a high negative value the disposition of the lines of equipotential are substantially interchanged between the two transistors so that current flow becomes proportionately more lateral in the NPN transistor and less lateral, more vertical in the PNP transistor. However, because the induced charge in the substrate 11 now is negative, injected holes will be attracted to the bottom of the pocket in the PNP transistor, to flow to the collector zone 17 along the oxide layer. Thus, current flow will tend to be more vertical and less lateral, proportionately. In the NPN transistor, the injected electrons will be repelled by the induced charge and the tendency to lateral flow already provided by the equipotential lines will be further enhanced while vertical flow will be proportionately reduced.

In an alternative embodiment of the invention the material of the pockets may consist of high resistivity N-type silicon referred to as $\nu$ material.

Likewise, in this alternative arrangement the application of a high negative potential to the substrate will produce a modification of the mixture of lateral and vertical current flow in the complementary transistor pair. Thus, the complementary transistor pairs may be designed and operated so as to optimize particular desired performance characteristics.

We claim:

1. A composite semiconductor device 10 for a high voltage integrated circuit having a plurality of pockets 12, 14 of monocrystalline semiconductor material of P conductivity type dielectrically isolated from each other by a layer of insulating material 13, 15 underlying the bottom and sides thereof, said pockets being supported in a layer 11 of polycrystalline semiconductor material and having a surface in a common plane of said device, CHARACTERIZED IN THAT
  (a) there is a first pocket 12 containing a pn$\pi$p transistor and a second pocket 14 containing a np$\pi$n transistor, and
  (b) the semiconductor material of said pockets has a resistivity in the range of from about 75 ohm cm to about 300 ohm/cm.

2. A composite semiconductor device for a high voltage integrated circuit having a plurality of pockets of monocrystalline semiconductor material of n conductivity type dielectrically isolated from each other by a layer of insulating material underlying the bottom and sides thereof, said pockets being supported in a layer of polycrystalline semiconductor material and having a surface in a common plane of said device, Characterized in that:
  (a) there is a first pocket containing a pn$\nu$p transistor and a second pocket containing a np$\nu$n transistor, and
  (b) the semiconductor material of said pockets has a resistivity at least on the order of 75 ohm cm.

3. A semiconductor device in accordance with claim 1 or 2 in which the pockets of semiconductor material have a depth from the common plane surface of from about 30 to about 50 microns and said insulating layer is silicon oxide having a thickness of from about 1.5 to about 5 microns.

4. A semiconductor device in accordance with claim 3 in which the polycrystalline semiconductor layer 11 has a resistivity of the order of 100 ohm cm.

5. A composite semiconductor device for a high voltage integrated circuit having a plurality of pockets of monocrystalline semiconductor material of a first conductivity type dielectrically isolated from each other by a layer of insulating material underlying the bottom and sides thereof, said pockets being supported in a layer of polycrystalline semiconductor material and having a surface in a common plane of said device, Characterized in that:
  (a) the semiconductor material of said pockets is p-type conductivity having a resistivity in the range of from about 75 ohm cm to about 300 ohm cm and is of substantially uniform purity distribution, (b) there is a first pocket containing a pn$\pi$p transistor and a second pocket containing a np$\pi$n transistor, (c) the layer of polycrystalline material is n-type conductivity silicon having a resistivity of the order of 100 ohm cm and includes contacting means for applying a potential thereto.

6. A semiconductor device in accordance with claim 5 in which said pockets have a depth of from about 30 to about 50 microns and said insulating layer has a thickness of from about 1.5 to 5 microns.

* * * * *